United States Patent [19]

Yoshida et al.

[11] 4,086,642
[45] Apr. 25, 1978

[54] PROTECTIVE CIRCUIT AND DEVICE FOR METAL-OXIDE-SEMICONDUCTOR FIELD EFFECT TRANSISTOR AND METHOD FOR FABRICATING THE DEVICE

[75] Inventors: Isao Yoshida; Ryoichi Hori, both of Tokyo; Hiroo Masuda; Osamu Minato, both of Kokubunji; Jun Etoh, Hino; Masaaki Nakai, Kokubunji, all of Japan

[73] Assignee: Hitachi, Ltd., Japan

[21] Appl. No.: 648,714

[22] Filed: Jan. 13, 1976

[30] Foreign Application Priority Data

Jan. 16, 1975  Japan .................................. 50-6264

[51] Int. Cl.² ............................................ H02H 9/04
[52] U.S. Cl. ...................................... 361/91; 307/304; 361/58
[58] Field of Search ............... 361/56, 58, 91; 323/16, 323/19; 307/304, 251, 296, 297

[56]  References Cited
U.S. PATENT DOCUMENTS

| | | | |
|---|---|---|---|
| 3,303,413 | 2/1967 | Warner, Jr. et al. | 307/304 |
| 3,403,270 | 9/1968 | Pace et al. | 307/304 |
| 3,508,084 | 4/1970 | Warner, Jr. | 307/304 |
| 3,777,216 | 12/1973 | Armstrong | 361/91 |
| 3,947,727 | 3/1976 | Stewart | 361/91 |
| 4,044,373 | 8/1977 | Nomiya et al. | 307/304 |

OTHER PUBLICATIONS

*Electronics World*, Oct. 1967, "Using The New Constant-Current Diodes" by Lancaster, pp. 30, 31, 78.
*IEEE Journal of Solid-State Circuit*, vol. sc-s, No. 6, Dec. 1970, pp. 364-365.
*Electronic Design 12*, Jun. 7, 1976, p. 160.

*Primary Examiner*—Gerald Goldberg
*Attorney, Agent, or Firm*—Craig & Antonelli

[57]  ABSTRACT

A protective circuit comprises a metal-oxide-semiconductor field effect transistor (MOSFET) to be protected, and a depletion-type MOSFET the gate and source of which are connected to each other and the souce of which is connected to the gate of the MOSFET to be protected, whereby the protective circuit which is suitable for a high-speed operation is completed.

4 Claims, 13 Drawing Figures

4,086,642

PROTECTIVE CIRCUIT AND DEVICE FOR METAL-OXIDE-SEMICONDUCTOR FIELD EFFECT TRANSISTOR AND METHOD FOR FABRICATING THE DEVICE

FIELD OF THE INVENTION

This invention relates to a protective circuit and device for a metal-oxide-semiconductor field effect transistor (MOSFET), which is suitable for a high-speed operation, and to a method for fabricating said protective device.

BACKGROUND OF THE INVENTION

In a protective circuit and device for protecting an insulator for a gate of the MOSFET to be protected from destruction, it has been required for the circuit and device to have characteristics that it operates as a large resistance for an excessive input and as a small resistance for a signal input.

Although there is a generally known protective circuit wherein the breakdown characteristic of a diode is utilized, this circuit cannot satisfy the requirement since a resistor in series with the gate of the MOSFET to be protected should be utilized.

There has been proposed a protective circuit which satisfies the requirement, wherein a depletion-type MOSFET the source of which is connected to the gate of the MOSFET to be protected and the gate of which is grounded is utilized. This circuit, however, has such drawbacks that the integration of a device corresponding to this circuit becomes difficult since the gate should be grounded, circuit design becomes complex, and the gate insulator of the protecting MOSFET may be destroyed by an excessive input.

SUMMARY OF THE INVENTION

It is, therefore, an object of the present invention to provide a protective circuit and device which satisfies the above-mentioned requirement and which solves the drawbacks in the conventional protective circuit and device.

Another object of the present invention is to provide a protective circuit and device which has a favorable characteristic for protecting the insulator for the gate of MOSFET to be protected from the destruction thereof.

A further object of the present invention is to provide a protective device which is easily fabricated.

A still further object of the present invention is to provide a method for fabricating the protective device.

To accomplish the above objects, in the present invention, the protective circuit or device includes a depletion-type MOSFET, the gate and source of which are connected to each other and the source of which is connected to the gate of the MOSFET to be protected.

BRIEF DESCRIPTION OF THE DRAWINGS

Similar reference numerals are used for identical items throughout the drawings.

DETAILED DESCRIPTION OF THE PRIOR ART

Figure 1:
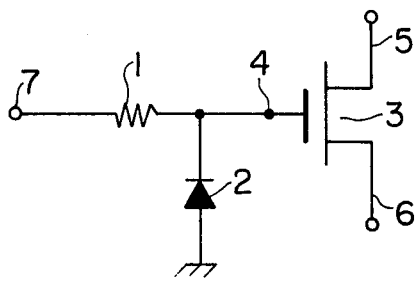
FIG. 1 is a circuit diagram of a conventional protective circuit and MOSFET to be protected.

It is well known in the art that a protective circuit, as is shown in FIG. 1, includes a resistor 1 and a diode 2, for protecting the gate insulator of the MOSFET 3 from destruction. In the figure, reference numberals 5 and 6 designate the source and the drain of the MOSFET 3, respectively. This circuit functions such that when an excessive input is introduced to an input terminal 7, the diode 2 breaks down and hence, the excessive input is not applied to the gate 4 of the MOSFET 3. The resistor 1, which is connected to the gate 4, is for preventing the instantaneous application of the excessive input to the gate 4 of MOSFET 3. This resistor 1, however, also attenuates the signal input. Especially, in a high-speed operation, this resistor 1 creates a large problem. Therefore, this protective circuit cannot satisfy the requirement for the protective circuit, that is, the requirement that the protective circuit should have characteristics that it operates as a large resistance for an excessive input and as a small resistance for a normal signal input.

Figure 2:
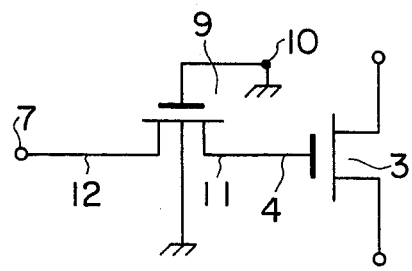
FIG. 2 is a circuit diagram of another conventional protective circuit and MOSFET to be protected.

A conventional protective circuit which satisfies this requirement is shown in FIG. 2. This protective circuit comprises a depletion-type MOSFET 9, the gate of which is grounded and the source 12 and drain 11 of which are connected to the gate 4 and the input terminal 7 of MOSFET 3 to be protected, respectively.

This circuit, however, has the following drawbacks.

First, integration of a semiconductor device corresponding to this circuit becomes difficult, since it is very difficult to constitute, in an integrated circuit device, a semiconductor structure wherein the gate is grounded. Practically, the structure is completed by providing a semiconductor region the conductivity type of which is the same as the impurity concentration of which is higher than those of the semiconductor body in which the MOSFET is formed, at a surface portion of the body, and connecting the gate to the semiconductor region.

Secondly, circuit design becomes complex. That is, since it becomes necessary in this circuit that the threshold voltage $V_{TD}$ of the depletion-type MOSFET 9 should be higher than the voltage $V_S$ of the source 11, it becomes difficult to utilize a depletion-type MOSFET which is similar to the MOSFET 3 to be protected.

Thirdly, it may happen that destruction of the gate insulator of MOSFET 9 occurs when an excessive input is applied to the input terminal 7. This happens because, when an excessive input is introduced to the input terminal 7, not only the potential of the drain 12 is increased, but also that of the source 11 is increased, since the gate potential is fixed, and an excessive voltage is applied between the source 11 and the gate 10.

These drawbacks in the conventional protective circuits are solved by the present invention which comprises a depletion-type MOSFET the gate and source of which are connected to each other and the source of which is connected to the gate of the MOSFET to be protected.

DETAILED DESCRIPTION OF THE INVENTION

Figure 3:
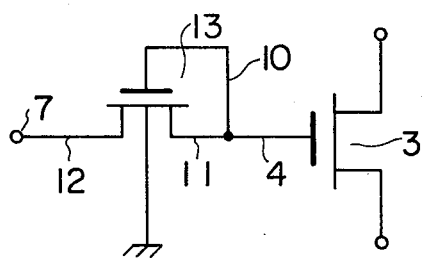
FIG. 3 is a circuit diagram of one embodiment of the present invention.

FIG. 3 is a circuit diagram of one embodiment of the present invention, which comprises a depletion-type MOSFET 13 the gate 10 and source 11 of which are connected to each other, the source 11 of which is connected to the gate 4 of the MOSFET 3 to be protected, and the drain 12 of which is connected to the input terminal 7.

In this circuit, the MOSFET 13 functions such that an excessive voltage is not applied to the gate 4 of the MOSFET 3. When an excessive input is introduced to the drain 12 through the input terminal 7, the potential of the source 11 instantaneously increases. However, simultaneously, the resistance between the drain 12 and the source 11 increases due to the bias-effect of a semiconductor body for the MOSFET 13, and hence an increase in the potential of the source 11 is suppressed. Further, in this circuit, destruction of the gate insulator of the MOSFET 13 is hardly caused, since the gate potential increases accompanied by an increase in the potentials of the source 11 and the drain 12 and, hence, the excess voltage is hardly applied to the gate insulator of the MOSFET 13.

Figure 4:
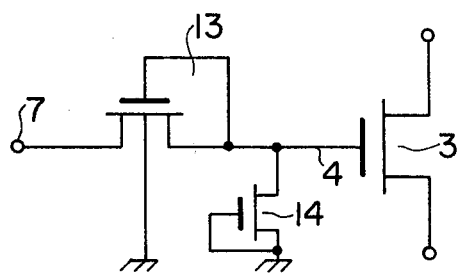
FIGS. 4 and 5 are circuit diagrams of other embodiments of the present invention.

FIG. 4 is a circuit diagram of another embodiment of the present invention, which comprises a depletion-type MOSFET 13 the gate and source of which are connected to each other and the source of which is connected to the gate 4 of the MOSFET 3 to be protected and an enhancement-type MOSFET 14 the gate and source of which are connected to each other and the drain of which is connected to the gate 4 of the MOSFET 3. In this circuit, the gate insulator of the MOSFET 3 is protected due to the breakdown of the enhancement-type MOSFET 14.

Figure 5:
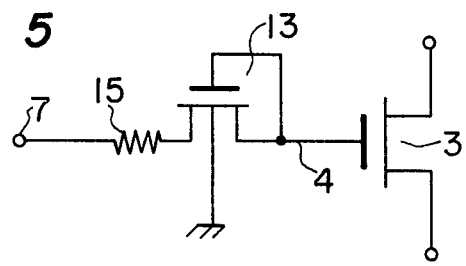

FIG. 5 is a circuit diagram of a further embodiment of the present invention, which comprises a depletion-type MOSFET 13 the gate and source of which are connected to each other and the source of which is connected to the MOSFET 3 to be protected, and a resistor 15 is disposed between the drain of the MOSFET 13 and the input terminal 7. Although the operation of this circuit is the same as that of the circuit shown in FIG. 3, this circuit has an advantage that a higher excessive input, than that in the circuit shown in FIG. 3 can be introduced to the input terminal of this circuit, since the breakdown voltage of this circuit is increased when compared with the circuit shown in FIG. 3, due to the resistor 15. It is preferable to utilize a saturation-type resistor for the resistor 15. Hereupon, the device comprising the resistor 15 and the MOSFET 13 may be deemed as a depletion-type MOSFET having an offset gate structure the threshold voltage of which is high.

Figure 6:
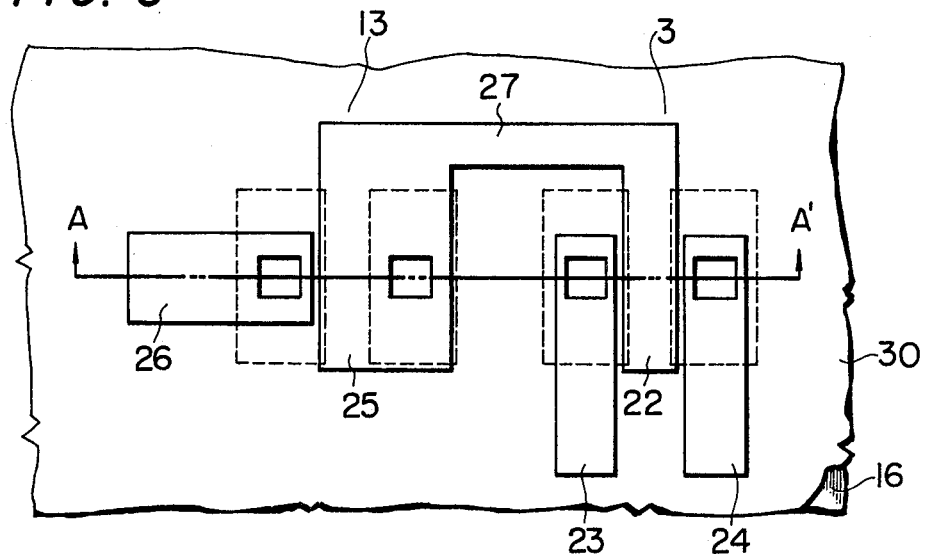
FIGS. 6 and 7 are, respectively, a plan view and a sectional view of a semiconductor device corresponding to the circuit diagram shown in FIG. 3.
Figure 7:
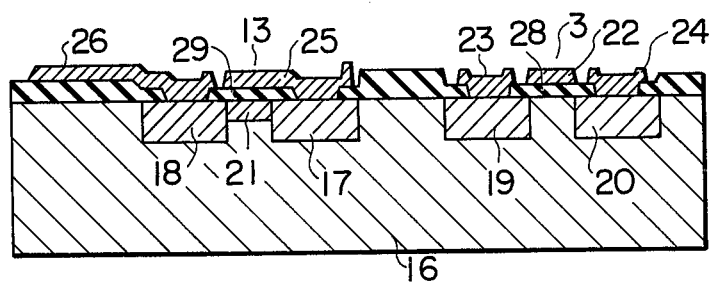

One example of concrete semiconductor devices corresponding to the protective circuit shown in FIG. 3 is shown in FIGS. 6 and 7, which are a plan view and a sectional view thereof, respectively.

FIG. 7 shows the section of the semiconductor device shown in FIG. 6, taken along A-A' in FIG. 6.

This protective device comprises a semiconductor body 16 of n-type Si the impurity concentration of which is about $10^{15}$ cm$^{-3}$, semiconductor regions 17, 18, 19 and 20, each of which is a p-type and has an impurity concentration of about $10^{20}$ cm$^{-3}$, disposed in predetermined portions of said body 16, a semiconductor region 21, disposed in the body 16 between semiconductor regions 17 and 18, the conductivity type of which is p-type and the impurity concentration of which is about $5 \times 10^{16}$ cm$^{-3}$, a gate insulator 28 of SiO$_2$ having a thickness of about 1000 A disposed on the surface of the body 16 at a corresponding portion between the semiconductor regions 19 and 20, a gate insulator 29 of SiO$_2$ having a thickness of about 1000 A disposed on the surface of the body 16 at a corresponding portion between the semiconductor regions 17 and 18, a conductor 22 of Al disposed on the gate insulator 28, conductors 23, 24, and 26 of Al connected to said semiconductor regions 19, 20 and 18, respectively, a conductor 25 of Al disposed on the gate insulator 29 and connected to the semiconductor region 17, and a conductor 27 of Al connected to the conductors 22 and 25.

In this device, the semiconductor regions 19 and 20 function as the source (or drain) and as the drain (or source) of the MOSFET 3 to be protected, respectively, the conductor 22 as the gate of the MOSFET 3, the semiconductor regions 17 and 18 as the source and the drain of the MOSFET 13, respectively, and a part of the conductor 25 on the part of the gate insulator 29 corresponding to the semiconductor region 21 as the gate of the MOSFET 13.

As is apparent from FIG. 6, the source of the MOSFET 13 is connected to the gate of the MOSFET 3 to be protected through the conductor 27. The area required for connecting the source of the MOSFET 13 to the gate of the MOSFET 3, that is, the area of the conductor 27 is not increased much, when compared with the area required for the two MOSFETs 3 and 13, and, hence, it may be said that this protective semiconductor device is suitable for a highly integrated circuit semiconductor device.

A method for fabricating the protective semiconductor device will be explained hereinafter referring to FIGS. 8 to 11 which are sectional views of semiconductor devices.

Figure 8:
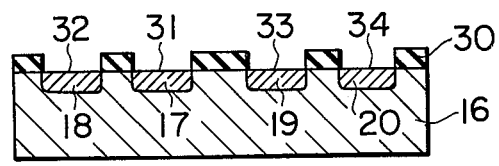
FIGS. 8 to 11 are sectional views of semiconductor devices, for explaining a method for fabricating the semiconductor device shown in FIG. 7.

On an n-type Si body 16 having an impurity concentration of about $10^{15}$ cm$^{-3}$, an SiO$_2$ film 30 having a thickness of about 8000 A is formed, and the SiO$_2$ film 30 is selectively etched so as to expose predetermined portions 31, 32, 33 and 34 of the surface of the body 16. BN is deposited on the predetermined portions 31, 32, 33 and 34 in an N$_2$ atmosphere, and then the atmosphere is changed to O$_2$ and the body 16 is heated at a temperature of about 1050° C for about 10 minutes, whereby diffused regions 17, 18, 19 and 20, each of which has a thickness of about 1 micron, are formed in the body 16 at corresponding predetermined portions 31, 32, 33 and 34, respectively, as is shown in FIG. 8.

Figure 9:
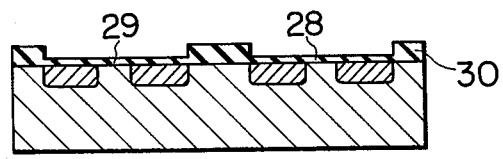

After the SiO$_2$ films 30, between the diffused regions 17 and 18 and between the diffused regions 19 and 20, and oxide films formed on the surfaces of the diffused regions 17, 18, 19 and 20 during the impurity diffusion are etched away, the body 16 is heat-treated at a temperature of about 1200° C for about 30 minutes in a dry oxygen atmosphere, whereby new SiO$_2$ films 28 and 29, each of which has a thickness of about 1000 A are formed on the surfaces of the diffused regions 19 and 20 and of the body 16 between the regions 19 and 20, and on the surfaces of the diffused regions 17 and 18, and of the body 16 between the regions 17 and 18, respectively (FIG. 9).

Figure 10:
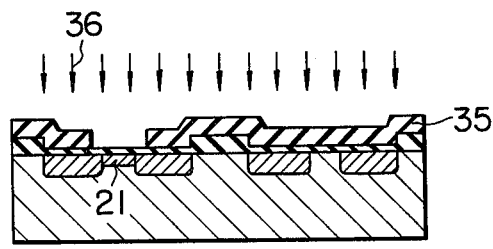

A photoresist 35 of KTFR (available from Eastman Kodak Co.)whose thickness is about 1.5 microns on the surfaces of the SiO$_2$ layer 30 and the new SiO$_2$ films 28 and 29 is selectively etched, so as to expose a portion of the surface of the new SiO$_2$ film 29 at least corresponding to the part between the diffused regions 17 and 18. Then, boron ions 36, having an energy of 80 KeV, are directed to the body 16 so as to implant boron ions at a concentration of about $5 \times 10^{11}$ cm$^{-2}$ into the body 16 between the diffused regions 17 and 18. The implanted region 21 has a depth of about 0.2 microns (FIG. 10).

After the ion implantation, the n-type Si body 16 is heat-treated at a temperature of about 950° C for about 30 minutes so as to repair the damage caused at the surface portion of the body 16 due to the ion implantation. During this heat-treatment, the depth of the implanted region 21 is increased by about 0.1 microns.

Figure 11:
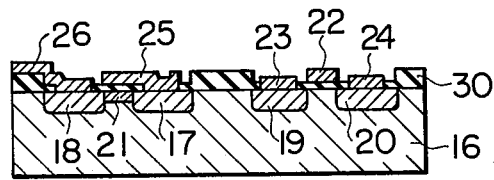

After the photoresist 35 is removed, predetermined portions of the new SiO$_2$ films 28 and 29 are etched away, so as to expose the surfaces of the diffused regions 19, 20, 17 and 18. Aluminum is then evaporated on the surfaces of the SiO$_2$ layer 30, of the new SiO$_2$ films 28 and 29 and of the exposed surfaces of the diffused regions 17, 18, 19 and 20, and the evaporated aluminum is etched so as to form the conductors 22, 23, 24, 25, 26 and 27 shown in FIGS. 6 and 7 (FIG. 11).

Figure 12:
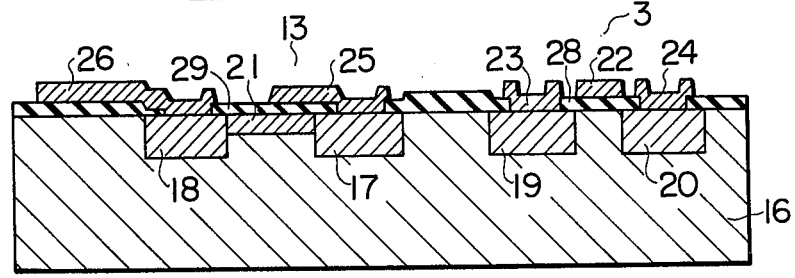
FIGS. 12 and 13 are sectional views of semiconductor devices corresponding to circuit diagram shown in FIG. 5.

FIG. 12 is a sectional view of a protective semiconductor device of the present invention, corresponding to the circuit diagram shown in FIG. 5, which has a depletion-type MOSFET having an offset gate structure.

As is apparent from FIGS. 7 and 12, in the device shown in FIG. 12, the gate electrode which is a part of a conductor 37 does not cover the entire surface of the insulating film 29 corresponding to the semiconductor region 21. This structure is offset gate structure, and corresponds to the resistor 15 and the MOSFET 13 of the circuit diagram shown in FIG. 5.

Figure 13:
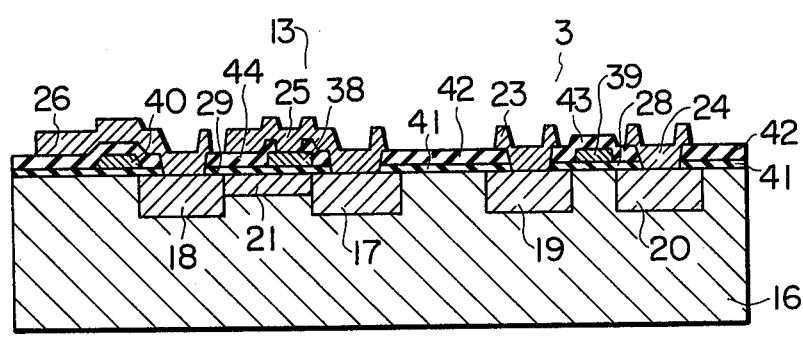

FIG. 13 is a sectional view of another protective semiconductor device of the present invention, corresponding to the circuit diagram shown in FIG. 5.

The differences between the devices shown in FIGS. 12 and 13 are that the device shown in FIG. 13 has a two-layered insulating film consisting of a SiO$_2$ layer 41 and a phospho-silicate glass layer 42, instead of the SiO$_2$ layer 30 in FIG. 12, and further includes polycrystalline Si layers 38, 39 and 40 disposed on the part of the surface of the insulating film 29 corresponding to the semiconductor region 21, on the part of the surface of the insulating film 28 corresponding to the body 16 between the semiconductor regions 19 and 20, and on the surface of the SiO$_2$ layer 41 corresponding to the portion of the body 16 adjacent to the semiconductor region 18, and phospho-silicate glass layers 43 and 44 disposed on the insulating films 28 and 29 and the polycrystalline Si layers 39 and 38, respectively. The phospho-silicate glass layers 43 and 44 have through hole or holes for contacting conductors 25 and 27 to the polycrystalline Si layers 38 and 39.

In this semiconductor device, a stacked gate structure which increases the reliability of the characteristics of the MOFSET, is employed for the gate of the MOSFET 13. Further, the polycrystalline Si layer 40 is a field plate for lowering the breakdown voltage of the junction between the semiconductor region 18 and the body 16, at which junction breakdown occurs for an excessive input.

Although the preferred embodiments of the present invention have been described above, the present invention is not limited to those embodiments.

For example, although the impurity concentration and the depth of the semiconductor region 21 are of $5 \times 10^{16}$ cm$^{-3}$ and 0.3 microns, respectively, in the embodiments, it is preferable that these are in the ranges of from $10^{15}$ to $10^{17}$ cm$^{-3}$ and of from 0.02 to 0.2 microns, respectively.

Although, in the embodiments, n-type Si is utilized as the semiconductor body, p-type Si may be utilized, and although boron is utilized for the impurities for the n-type Si body in the embodiments, other impurities may be utilized.

While the present invention has been shown and described in terms of the best mode contemplated for carrying out the invention, it will be appreciated that changes and modifications can be made which do not depart from the inventive concepts taught herein. Such changes and modifications are deemed to be within the perview of the present invention.

What is claimed is:

1. A protective circuit for a metal-oxide-semiconductor field effect transistor comprising:
    an input terminal to which input signals are applied; and
    a depletion-type metal-oxide-semiconductor field effect transistor the gate and source of which are connected to each other, the source of which is connected to the gate of the transistor to be protected, and the drain of which is coupled to said input terminal.

2. A protective circuit according to claim 1, which further comprises an enhancement-type metal-oxide-semiconductor field effect transistor the gate and source of which are connected to each other and the drain of which is connected to the source of said depletion-type transistor.

3. A protective circuit according to claim 1, which further comprises a resistor connected between the drain of said depletion-type transistor and said input terminal.

4. A protective circuit according to claim 1, wherein the resistance between the drain and source is increased during increased voltage applied to said input terminal, such that increased potential of the source is suppressed.

* * * * *